US008525557B1

(12) United States Patent
Lewis

(10) Patent No.: US 8,525,557 B1
(45) Date of Patent: Sep. 3, 2013

(54) MERGED TRISTATE MULTIPLEXER

(75) Inventor: David Lewis, Toronto (CA)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 13/289,841

(22) Filed: Nov. 4, 2011

(51) Int. Cl.
*G06F 1/08* (2006.01)

(52) U.S. Cl.
USPC .............. 327/99; 327/408; 327/409; 327/410

(58) Field of Classification Search
USPC ................... 327/99, 108, 112, 403, 404, 407, 327/408, 409, 410
See application file for complete search history.

(56) References Cited

U.S. PATENT DOCUMENTS

| 4,593,390 | A  | * | 6/1986 | Hildebrand et al. | 370/541 |
| 5,543,731 | A  | * | 8/1996 | Sigal et al. | 326/40 |
| 5,955,912 | A  | * | 9/1999 | Ko | 327/410 |
| 6,507,929 | B1 | * | 1/2003 | Durham et al. | 714/823 |
| 6,982,589 | B2 | * | 1/2006 | Veeramachaneni et al. | 327/408 |
| 2008/0129334 | A1 | * | 6/2008 | Sunkavalli et al. | 326/38 |
| 2010/0045349 | A1 | * | 2/2010 | Wang et al. | 327/108 |

* cited by examiner

*Primary Examiner* — Lincoln Donovan
*Assistant Examiner* — Jung H. Kim
(74) *Attorney, Agent, or Firm* — Mauriel Kapouytian Woods LLP; Michael Mauriel

(57) ABSTRACT

Various methods and structures related to tristate multiplexer circuits are disclosed. An embodiment provides a selection circuit in which selectively enabled input circuits are coupled to an output circuit through an output enable circuit such that a selected one of the selectively enabled input circuits is operable to provide a pathway for charging and discharging currents used to charge and discharge an output circuit transistor gate. This and other detailed embodiments are described more fully in the disclosure.

19 Claims, 4 Drawing Sheets

MERGED TRISTATE MULTIPLEXER

FIELD OF THE INVENTION

This invention relates generally to tristate circuitry.

BACKGROUND

Tristate driver circuits are used to conditionally drive a signal onto a wire that is shared by multiple resources. Tristate driver circuits are sometimes used in conjunction with multiplexer circuits. The multiplexer may provide a selected input to the tristate driver which in turn drives the signal onto the shared resource wire. Multiplexers can be built in various ways. A multiplexer may be constructed from pass transistors. A multiplexer may also be constructed from a plurality of internal tristate circuits. A multiplexer may be a constructed from smaller multiplexer circuits which form stages of a larger multiplexer.

FIGS. 1A and 1B illustrate two different prior art tristate circuits. FIG. 1A illustrates a known inverting tristate driver 101. Circuit 101 is constructed from two stacked PMOS transistors, 11P and 12P and two stacked NMOS transistors 11N and 12N coupled as shown. The circuit is enabled as follows: A high enable signal at input en and a corresponding low negative enable signal at input n-en turn on, respectively, transistor 12N and transistor 11P which allows the signal at IN1A to drive an inverted signal at output OUT1A through transistors 12P and 11N. The opposite signals at input en and input n-en would turn off, respectively, transistor 12N and transistor 11P which in turn would prevent an input signal at input IN1A from driving a signal at output OUT1A.

FIG. 1B illustrates a known non-inverting tristate driver 102. Tristate driver 102 includes PMOS transistors 13P, 14P, 15P, and 16P and NMOS transistors 13N, 14N, 15N, and 16N. Circuit 102 is enabled as follows: A high enable signal at input en turns on transistor 13N and turns off transistor 14P and a low negative enable signal at input n-en turns off transistor 15N and turns on transistor 15P which allows the signal at IN1B to drive a non-inverted signal at output OUT1B through transistors 13P, 14N, 16P, and 16N. The opposite signal (i.e., a low) at enable input en would turn off transistor 13N and turn on transistor 14P and the opposite signal (i.e. a high) at negative enable input n-en would turn on transistor 15N and turn off transistor 15P which will prevent a signal at input IN1B from driving a signal at output OUT1B.

SUMMARY

The transistor arrangement shown in FIG. 1A requires that the output node be charged and discharged through two series transistors. When a tristate driver such as inverting tristate driver 101 is used to drive a signal on a shared resource wire, this arrangement requires use of relatively larger transistors (roughly twice a large) for a given drive strength than would be required for a normal two-transistor CMOS inverter at the output (in which charging and discharging of the output node occurs through a single transistor). In view of the significant output load at outputs to some shared resource wires, the required drive strength, and thus the corresponding transistor size difference required using the FIG. 1A arrangement at an output, can be significant. Non-inverting tristate driver 102 shown in FIG. 1B, which just has a complimentary CMOS pair including 16P and 16N driving the output at OUT1B, allows use of relatively smaller drive transistors at that output. However, in this circuit, on currents for charging or discharging the gates of the output drive transistors (Ipon turns on transistor 16P and Inon turns on transistor 16N) both have to go through two transistors (in the case of Ipon, transistors 13N and 14N and in the case of Ion, transistors 13P and 13N) whereas the corresponding off currents for these transistors (Ipoff turns of transistor 16P and Inoff turns off transistor 13N) only have to go through one transistor (in the case of Ipoff, transistor 13P and in the case of Inoff, transistor 14N). This causes the transistors 16P and 16N to turn on more slowly than they turn off. Since 16P is turning on when 16N is turning off and vice versa, this can cause transitions in output signal wave forms to have longer rise/fall times than a simple inverter. Also, using a circuit such as circuit 102 of FIG. 1B to build all the input circuits of a tristate multiplexer requires 8N transistors where "N" is the number of selectable inputs.

One embodiment of the present invention provides a selection circuit in which selectively enabled input circuits are coupled to an output circuit through an output enable circuit such that a selected one of the selectively enabled input circuits is operable to provide a pathway for charging and discharging currents used to charge and discharge an output circuit transistor gate. In some embodiments, at least some of the selectively enabled input circuits comprise inverting tristate circuits including stacked PMOS and stacked NMOS transistors. In some embodiments, the output circuit comprises a two-transistor inverting CMOS stage such that an output node is charged and discharged through one transistor (e.g., charged through a PMOS transistor and discharged through an NMOS transistor). In one embodiment a gate of an output PMOS transistor is connected to a drain of a PMOS transistor in each of the plurality of input circuits and a gate of an output NMOS transistor is connected to a drain of an NMOS transistor in each of the plurality of input circuits. In another embodiment, a gate of an output PMOS transistor is connected to a drain of an NMOS transistor in each of the plurality of input circuits and a gate of an output NMOS transistor is connected to a drain of a PMOS transistor in each of the plurality of input circuits.

These and other embodiments are described more fully below. For purposes of illustration only, several aspects of particular embodiments of the invention are described by reference to the following figures.

DETAILED DESCRIPTION

The following description is presented to enable any person skilled iii the art to make and use the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
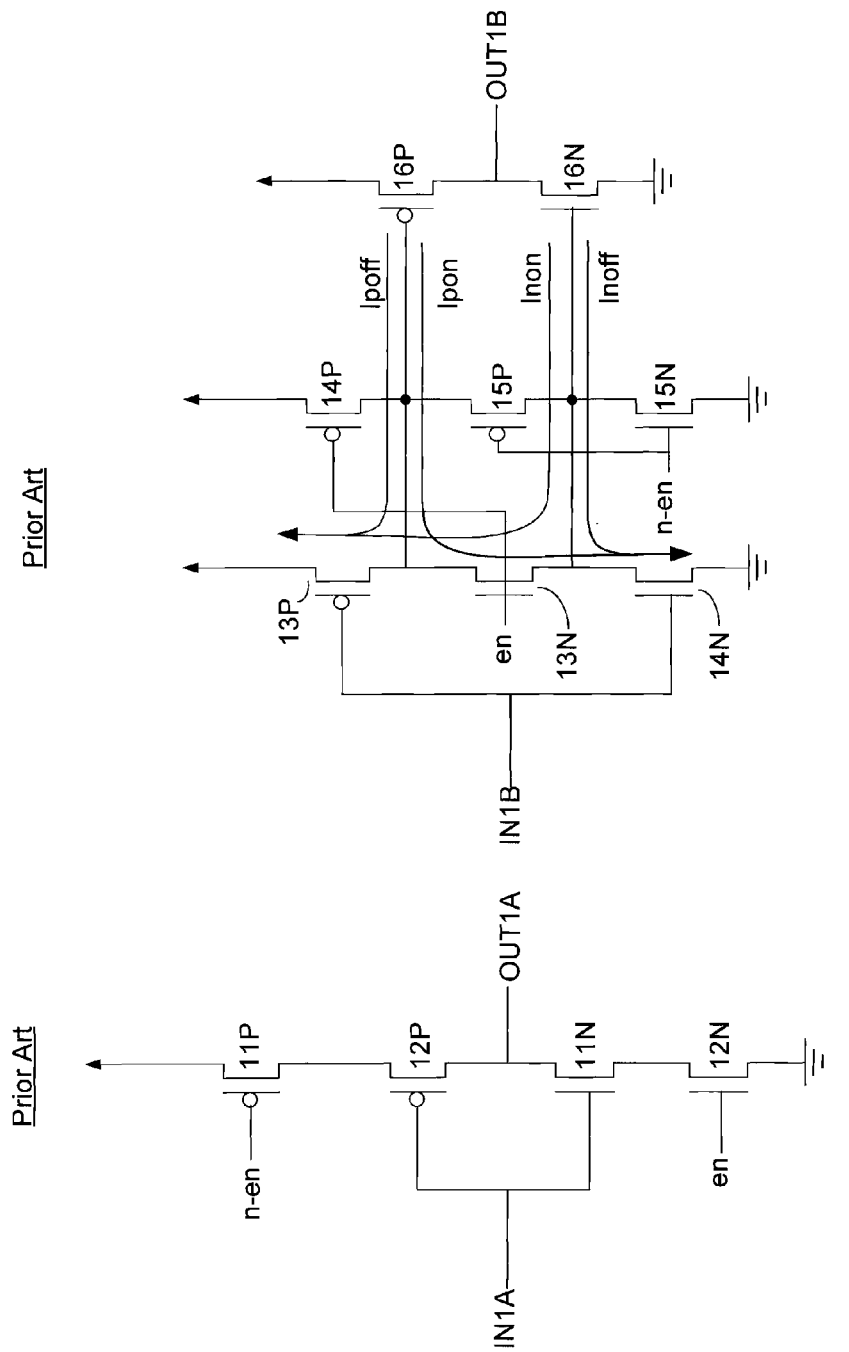
FIG. 1A illustrates a prior art inverting tristate driver.
FIG. 1B illustrates a prior art non-inverting tristate driver.
Figure 2:
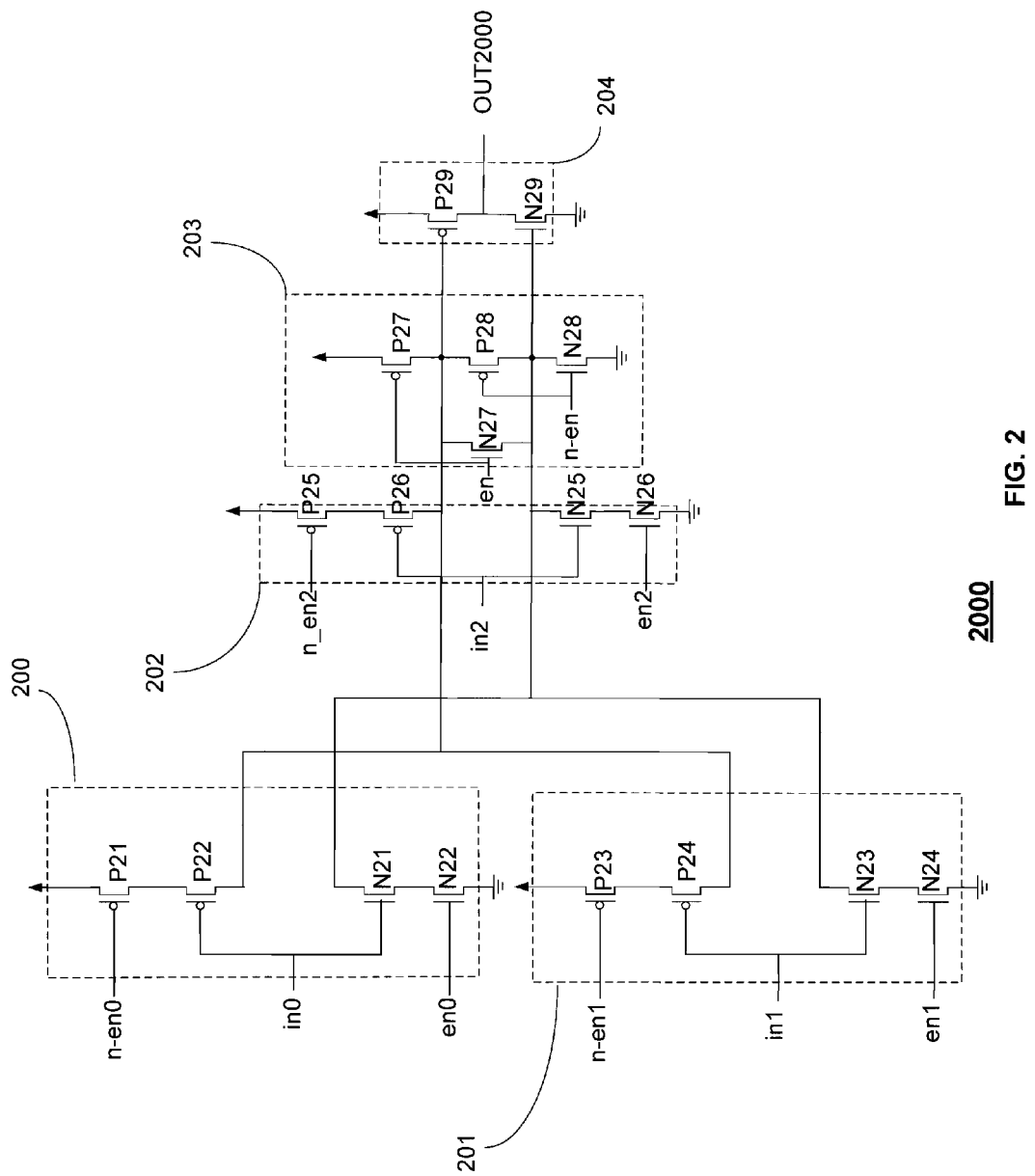
FIG. 2 illustrates an exemplary tristate multiplexer consistent with one embodiment of the present invention.

FIG. 2 illustrates a first embodiment of the present invention. Tristate multiplexer circuit 2000 comprises selectable input circuits 200, 201, and 202, output enable circuit 203, and output drive circuit 204. Selectable input circuits 200, 201, and 202 each include stacked PMOS transistors and stacked NMOS transistors as follows: Circuit 200 includes PMOS transistors P21 and P22 and NMOS transistors N21 and N22; circuit 201 includes PMOS transistors P23 and P24 and NMOS transistors N23 and N24; and circuit 202 includes PMOS transistors P25 and P26 and NMOS transistors N25 and N26. Enable circuit 203 comprises PMOS transistors P27 and P28 and NMOS transistors N27 and N28. Output circuit 204 comprises a CMOS pair including PMOS transistor P29 and NMOS transistor N29.

Tristate multiplexer 2000 has selectable inputs in0, in1, and in2 corresponding to input circuits 200, 201, and 202. Each selectable input circuit has enable and corresponding negative enable inputs. When input en0 is high (so that transistor N22 is on and input n-en0 is low (so that transistor P21 is on), then circuit 200 is enabled and a signal at input in0 is selected to drive output at output OUT2000. Similarly, when input en1 is high (so that transistor N24 is on) and input n-en1 is low (so that transistor P23 is on), then circuit 201 is enabled and a signal at input in1 is selected to drive output at output OUT2000. When input en2 is high (so that transistor N26 is on) and input n-en2 is low (so that transistor P25 is on), then circuit 200 is enabled and a signal at input in2 is selected to drive output at output OUT2000.

The transistors of output enable circuit 203 are coupled to output circuit 204 and to each of selectable input circuits 200, 201, and 202 in a manner such that when signal en is high (so that transistor N27 is on and transistor P27 is off) and signal n-en is low (so that transistor N28 is off and transistor P28 is on), switching currents for switching on and off output drive transistors P29 and N29 flow through transistors of a selected input circuit. For example, if output enable circuit 203 is enabled as described above and selectable input circuit 201 is also enabled, a signal at input in1 drives output at output OUT2000 through transistors P29 and N29 and the switching currents for those output transistor currents flow through selected input circuit 201 as follows: The discharge current for turning on transistor P29 flows through transistor N27 of enable circuit 203 and through transistors N23 and N24 of input circuit 201. The discharge current for turning off transistor N29 flows through transistors N23 and N24 of input circuit 201. The charging current for turning on transistor N29 flows through transistor P28 of enable circuit 203 and through transistors P23 and P24 of input circuit 201. The charging current for turning off transistor P29 flows through transistors P23 and P24 of input circuit 201.

As those skilled in the art will appreciate, operation occurs in a comparable fashion if another of the inputs is selected. In each case, discharge current for turning on output transistor P29 flows through transistor N27 of output enable circuit 203 and charging current for turning on transistor N29 flows through transistor P28 of output enable circuit 203. If input in0 is selected, then discharge currents for turning on output transistor P29 and turning off output transistor N29 flow through transistors N21 and N22 of input circuit 200. In that case, charging currents for turning on output transistor N29 and turning off output transistor P29 flow through transistors P21 and P22 of input circuit 200. If input in2 is selected, then discharge currents for turning on output transistor P29 and turning off output transistor N29 flow through transistors N25 and N26 of input circuit 202. In that case, charging currents for turning on output transistor N29 and turning off output transistor P29 flow through transistors P25 and P26 of input circuit 202.

In this sense, the illustrated embodiment, when enabled by enable circuit 203, "merges" tristate input and tristate output circuitry to form a tristate multiplexer. In other words, transistors of a tristate input circuit used tier selectable input are also used as pathways for the charging and discharging current of the tristate output driver circuit transistor gate voltages. The illustrated arrangement can be applied to a multiplexer with any number of inputs. It can also be applied as just part of a larger multiplexer that uses different types of selectable input circuitry. In other words, although in the illustrated embodiment, all of the selectable input circuits are constructed from inverting tristate circuit structures (modified to be coupled through an output enable circuit), in alternative embodiments, some multiplexer input circuits may be constructed differently. Also, some inputs may be higher speed inputs than others, passing through few stages before driving output circuitry.

Figure 3:
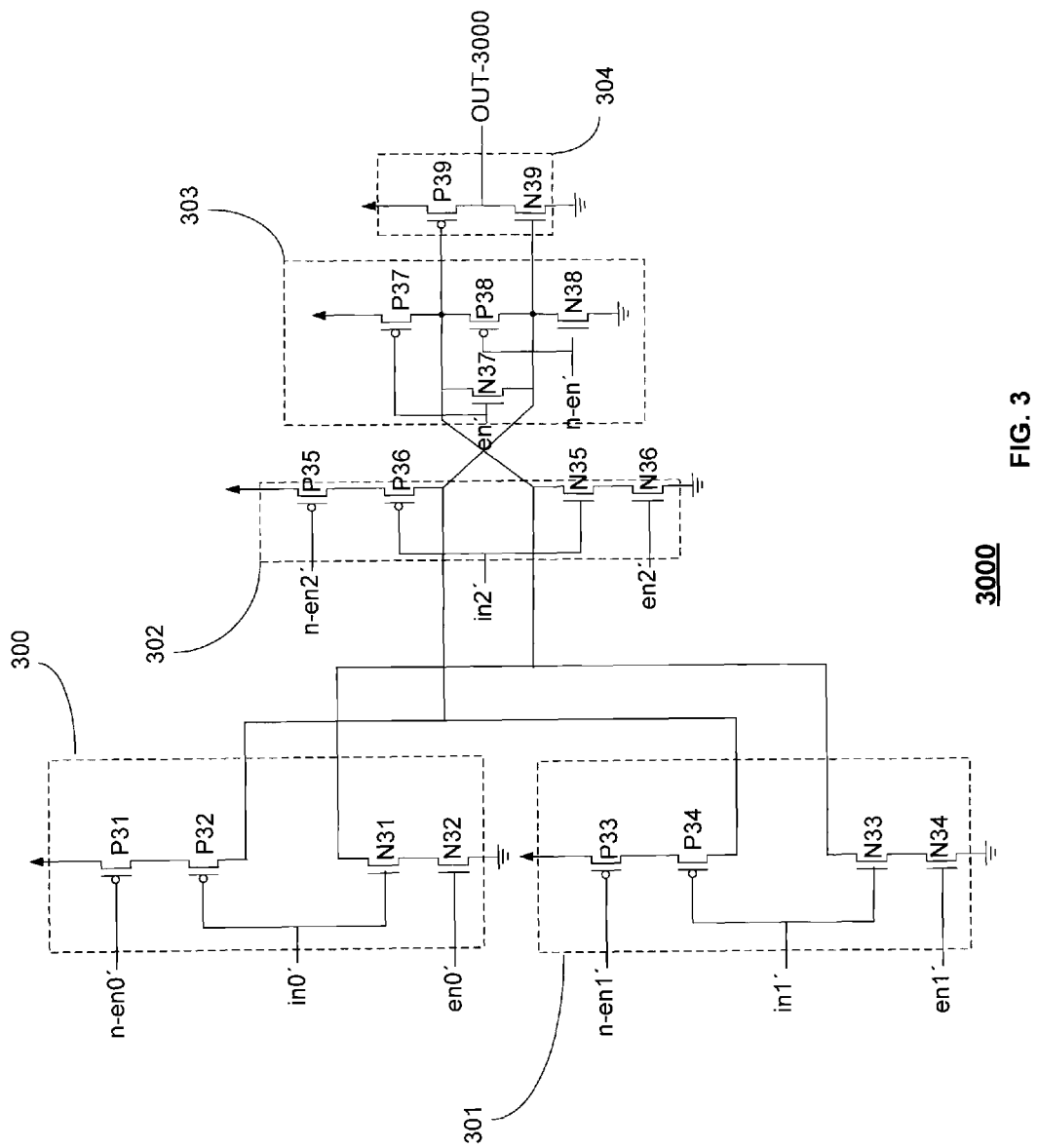
FIG. 3 illustrates an exemplary tristate multiplexer consistent with another embodiment of the present invention.

FIG. 3 illustrates an alternative embodiment of the present invention. Tristate multiplexer 3000 includes input circuits 300, 301, and 302, output enable circuit 303 and output circuit 304. The difference between circuit 3000 of FIG. 3 and circuit 2000 of FIG. 2 is that the circuit of FIG. 3 implements a "twisted" connection between input circuits and output PMOS and NMOS output drive transistors as will be further explained below.

Selectable input circuits 300, 301, and 302 each include stacked PMOS transistors and stacked NMOS transistors as follows: Circuit 300 includes PMOS transistors P31 and P32 and NMOS transistors N31 and N32; circuit 301 includes PMOS transistors P33 and P34 and NMOS transistors N33 and N34; and circuit 302 includes PMOS transistors P35 and P36 and NMOS transistors N35 and N36. Enable circuit 303 comprises PMOS transistors P37 and P38 and NMOS transistors N37 and N38. Output circuit 304 comprises a CMOS pair including PMOS transistor P39 and NMOS transistor N39.

Tristate multiplexer 3000 has selectable inputs in0', in1', and in2' corresponding to input circuits 300, 301, and 302. Each selectable input circuit has enable and corresponding negative enable inputs (en0' and n-en0' for input circuit 300, en1' and n-en1' for input circuit 301, and en2' and n-en2" for input circuit 302). These operate to enable or non-enable the selectable input circuits in the same manner already described in the context of the embodiment of FIG. 2 and so will not be further described herein.

The transistors of output enable circuit 303 are coupled to output circuit 304 and to each of selectable input circuits 300, 301, and 302 in a manner such that when signal en' is high (so that transistor N37 is on and transistor P37 is off) and signal n-en' is low (so that transistor N38 is off and transistor P38 is on), switching currents for switching on and off output drive transistors P39 and N39 flow through transistors of a selected input circuit. For example, if output enable circuit 303 is enabled as described above and selectable input circuit 301 is also enabled, a signal at input in1' drives output at output OUT3000 through transistors P39 and N39 and the switching currents for those output transistor currents flow through selected input circuit 301 as follows: The discharge current for turning on transistor P39 flows through transistors N33 and N34 of input circuit 301. The discharge current for turning off transistor N39 flows through transistor N37 of output enable circuit 303 and through transistors N33 and N34 of input circuit 301. The charging current for turning on transistor N39 flows through transistors P33 and P34 of input circuit

301. The charging current for turning off transistor P39 flows through transistor P38 of output enable circuit 303 and through transistors P33 and P34 of input circuit 301. As those skilled in the art will appreciate, operation occurs in a comparable fashion if another of the inputs is selected: On currents will flow through either PMOS transistors (if charging to turn on output transistor N39) or NMOS transistors (if discharging to turn on output transistor P39) of the corresponding selected input circuit. Off currents will similarly flow through PMOS (if charging to turn off P39) or NMOS (if discharging to turn off N39) transistors of the selected input circuit (i.e., for input circuit 300, P31 and P32 or N31 and N32 and for input circuit 302, P35 and P36 or N35 and N36). Off currents will also flow through a transistor of output enable circuit 303, i.e., through P38 if a charging off current or through N37 if a discharging off current.

Thus a difference between the embodiments of FIG. 2 and FIG. 3 is the following: In multiplexer 2000 of FIG. 2, the on switching currents for driving the output transistor gates travel through three transistors while the off currents travel through two transistors. By contrast, in multiplexer 3000 of FIG. 3, the on switching currents only travel through two transistors while the off currents travel through three transistors. The embodiment of FIG. 3 thus may provide somewhat less signal delay than the embodiment of FIG. 2, however it also has the possibility of greater short circuit current at the output since one transistor may turn on before its complement turns off.

Tristate multiplexer circuitry embodying the principles illustrated by the circuitry of FIG. 2 and/or FIG. 3 may be implemented as part of any IC. A specific example of an IC is a field programmable gate array ("FPGA"). FPGAs (also referred to as programmable logic devices ("PLDs"), complex PLDs, programmable array logic, programmable logic arrays, field PLAs, erasable PLDs, electrically erasable PLDs, logic cell arrays, or by other names) provide the advantages of fixed ICs with the flexibility of custom ICs. FPGAs have configuration elements (i.e., programmable elements) that may be programmed or reprogrammed. Placing new data into the configuration elements programs or reprograms the FPGA's logic functions and associated routing pathways. Such configuration may be accomplished via data stored in programmable elements on the IC. Programmable elements may include dynamic or static RAM, flip-flops, electronically erasable programmable read-only memory (EEPROM) cells, flash, fuse, anti-fuse programmable connections, or other memory elements. Configuration may also be accomplished via one or more externally generated signals received by the IC during operation of the IC. Data represented by such signals may or may not be stored on the IC during operation of the IC. Configuration may also be accomplished via mask programming during fabrication of the IC. While mask programming may have disadvantages relative to some of the field programmable options already listed, it may be useful in certain high volume applications.

Figure 4:
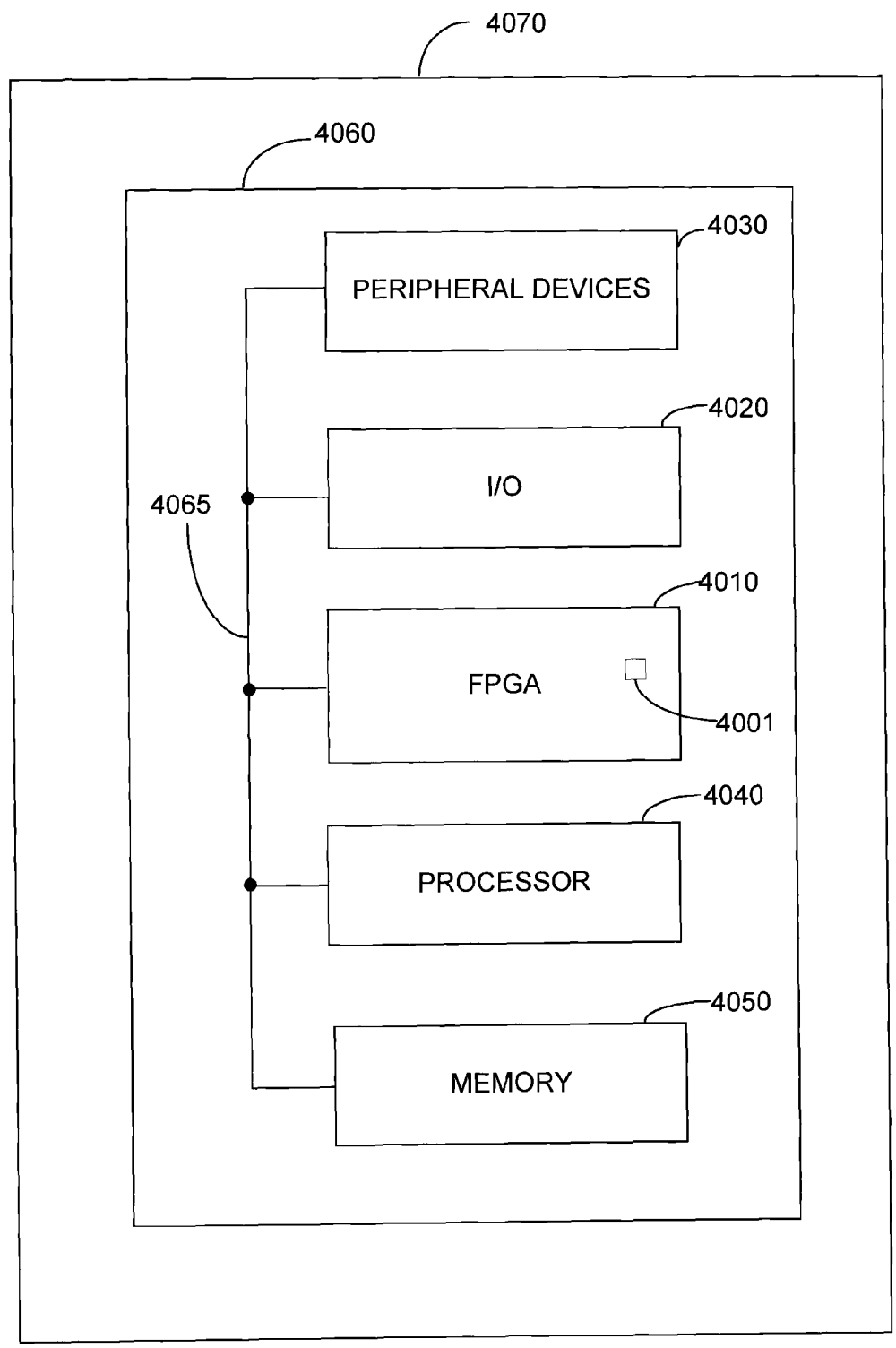
FIG. 4 illustrates an exemplary data processing system including a field programmable gate array ("FPGA") that includes exemplary selection circuits in accordance with an embodiment of the present invention.

FIG. 4 illustrates an exemplary data processing system 4000 including an FPGA 4010. FPGA 4010 includes several selection circuits such as selection circuit 4001 in accordance with an embodiment of the present invention.

Data processing system 4000 may include one or more of the following additional components: processor 4040, memory 4050, input/output (I/O) circuitry 4020, and peripheral devices 4030 and/or other components. These components are coupled together by system bus 4065 and are populated on circuit board 4060 which is contained in end-user system 4070. A data processing system such as system 4000 may include a single end-user system such as end-user system 4070 or may include a plurality of systems working together as a data processing system.

System 4000 can be used in a wide variety of applications, such as computer networking, data networking, instrumentation, video processing, digital signal processing, or any other application where the advantage of using programmable or reprogrammable logic in system design is desirable. FPGA 4010 can be used to perform a variety of different logic functions. For example, FPGA 4010 can be configured as a processor or controller that works in cooperation with processor 4040 (or, in alternative embodiments, an FPGA might itself act as the sole system processor). FPGA 4010 may also be used as an arbiter for arbitrating access to shared resources in system 4000. In yet another example, FPGA 4010 can be configured as an interface between processor 4040 and one of the other components in system 4000. It should be noted that system 4000 is only exemplary.

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiments but only by the following claims.

What is claimed is:

1. A selection circuit comprising:
   a plurality of selectable input circuits, each including enable elements arranged such that any one of the plurality of selectable input circuits is operable to be enabled independently of other input circuits of the plurality of input circuits;
   an output circuit comprising first and second output transistors; and
   an output enable circuit coupled between the output circuit and the plurality of input circuits such that the output enable circuit is operable to provide a switching current pathway through an enabled input circuit for charging and discharging voltage at a gate of a transistor of the output circuit;
   wherein a selectable input circuit of the plurality of selectable input circuits comprises: a stacked PMOS transistor pair and a stacked NMOS transistor pair; wherein: a gate of a first transistor in the stacked PMOS transistor pair and a gate of a first transistor in the stacked NMOS transistor pair are directly connected for receiving an input signal; the enable elements comprise a second transistor in the stacked PMOS transistor pair and a second transistor in the stacked NMOS transistor pair; a drain of a transistor in the stacked PMOS transistor pair and a gate of one of the first and second output transistors are directly connected; and a drain of a transistor in the stacked NMOS transistor pair and a gate of another of the first and second output transistors are directly connected.

2. The selection circuit of claim 1 wherein the output enable circuit is coupled to provide a switching current pathway for at least one of an output PMOS transistor off current, an output PMOS transistor on current, an output NMOS transistor on current and an output NMOS transistor off current.

3. The selection circuit of claim 1 wherein the output circuit comprises a two-transistor CMOS inverter circuit.

4. The selection circuit of claim 1 wherein the output enable circuit is coupled to drains of transistors in each input circuit of the plurality of input circuits and to gates of transistors of the output circuit.

5. The selection circuit of claim 1 wherein the output enable circuit is coupled between stacked PMOS and stacked NMOS transistors of each input circuit of the plurality of input circuits.

6. The selection circuit of claim 1 wherein the output circuit comprises an output PMOS transistor and an output NMOS transistor, a gate of the output PMOS transistor being coupled to a drain of a PMOS transistor in at least one input circuit of the plurality of input circuits and a gate of the output NMOS transistor being coupled to a drain of an NMOS transistor in at least one input circuit of the plurality of input circuits.

7. The selection circuit of claim 1 wherein the output circuit comprises an output PMOS transistor and an output NMOS transistor, a gate of the output PMOS transistor being coupled to a drain of an NMOS transistor in at least one input circuit of the plurality of input circuits and a gate of the output NMOS transistor being coupled to a drain of a PMOS transistor in at least one input circuit of the plurality of input circuits.

8. A multiplexer circuit comprising:
the selection circuit of claim 1; and
additional selectable input circuits coupled to the selection circuit of claim 1.

9. A field programmable gate array ("FPGA") comprising the selection circuit of claim 1.

10. A data processing system comprising the FPGA of claim 9.

11. A selection circuit comprising:
a plurality of selectable input circuits, each including enable elements arranged such that an input circuit of the plurality of input circuits is operable to be enabled independently of other input circuits of the plurality of input circuits;
an output circuit including first and second output transistors; and
an output enable circuit coupled between charging and discharging transistors of each of the plurality of input circuits, the output enable circuit operable to enable charging and discharging of an output circuit transistor gate voltage through a selected input circuit of the plurality of selectable input circuits;
wherein a selectable input circuit of the plurality of selectable input circuits comprises: a stacked PMOS transistor pair and a stacked NMOS transistor pair; wherein: a gate of a first transistor in the stacked PMOS transistor pair and a gate of a first transistor in the stacked NMOS transistor pair are directly connected for receiving an input signal; the enable elements comprise a second transistor in the stacked PMOS transistor pair and a second transistor in the stacked NMOS transistor pair; a drain of a transistor in the stacked PMOS transistor pair and a gate of one of the first and second output transistors are directly connected; and a drain of a transistor in the stacked NMOS transistor pair and a gate of another of the first and second output transistors are directly connected.

12. The selection circuit of claim 11 wherein the output circuit comprises a two-transistor CMOS inverter circuit.

13. The selection circuit of claim 11 wherein the output enable circuit is coupled to drains of transistors in each input circuit of the plurality of input circuits.

14. The selection circuit of claim 11 wherein the output enable circuit is coupled between stacked PMOS and stacked NMOS transistors of each input circuit of the plurality of input circuits.

15. The selection circuit of claim 11 wherein the output circuit comprises an output PMOS transistor and an output NMOS transistor, a gate of the output PMOS transistor being coupled to a drain of a PMOS transistor in at least one input circuit of the plurality of input circuits and a gate of the output NMOS transistor being coupled to a drain of an NMOS transistor in at least one input circuit of the plurality of input circuits.

16. The selection circuit of claim 11 wherein the output circuit comprises an output PMOS transistor and an output NMOS transistor, a gate of the output PMOS transistor being coupled to a drain of an NMOS transistor in at least one input circuit of the plurality of input circuits and a gate of the output NMOS transistor being coupled to a drain of PMOS transistor in at least one input circuit of the plurality of input circuits.

17. A multiplexer circuit comprising:
the selection circuit of claim 11; and
additional selectable input circuits coupled to the selection circuit of claim 11.

18. A field programmable gate array ("FPGA") comprising the selection circuit of claim 11.

19. A data processing system comprising the FPGA of claim 18.

\* \* \* \* \*